(12) United States Patent
Lee et al.

(10) Patent No.: US 7,842,943 B2
(45) Date of Patent: Nov. 30, 2010

(54) ORGANIC THIN FILM TRANSISTOR AND FLAT PANEL DISPLAY DEVICE USING THE SAME

(75) Inventors: Hun Jung Lee, Yongin (KR); Sang Il Park, Yongin (KR); Min Chul Suh, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 390 days.

(21) Appl. No.: 11/501,976

(22) Filed: Aug. 9, 2006

(65) Prior Publication Data

US 2007/0034867 A1    Feb. 15, 2007

(30) Foreign Application Priority Data

Aug. 11, 2005    (KR) .................... 10-2005-0073946

(51) Int. Cl.
*H01L 35/24*    (2006.01)
*H01L 51/00*    (2006.01)
*H01L 29/04*    (2006.01)
*H01L 31/036*    (2006.01)
*G09G 3/36*    (2006.01)

(52) U.S. Cl. .................. 257/40; 257/70; 257/E51.006; 345/98

(58) Field of Classification Search ............... 257/642, 257/643, 40, 98, 759, E39.007, E51.001, 257/E51.052, E27.117, E27.119, 72, E51.006; 438/88, 99, 610, 623, 780–781, 789–790, 438/793–794; 345/78, 98
See application file for complete search history.

(56) References Cited

U.S. PATENT DOCUMENTS

| 7,068,418 | B2* | 6/2006 | Kawase | 359/296 |
|---|---|---|---|---|
| 7,303,940 | B2* | 12/2007 | Eder et al. | 438/99 |
| 2001/0012648 | A1* | 8/2001 | Lee | 438/149 |
| 2001/0048147 | A1* | 12/2001 | Mizuhara et al. | 257/642 |
| 2002/0013021 | A1* | 1/2002 | Jeong et al. | 438/149 |
| 2003/0092214 | A1* | 5/2003 | Klauk et al. | 438/99 |
| 2003/0119232 | A1* | 6/2003 | Kim et al. | 438/151 |
| 2004/0056246 | A1* | 3/2004 | Yan et al. | 257/40 |
| 2004/0251474 | A1* | 12/2004 | Uchida et al. | 257/202 |

(Continued)

FOREIGN PATENT DOCUMENTS

JP    2003-298056    10/2003

(Continued)

OTHER PUBLICATIONS

Patent Abstracts of Japan, Publication No. 2003-298056, Published on Oct. 17, 2003, in the name of Yatsuse, et al.

(Continued)

*Primary Examiner*—David S Blum
(74) *Attorney, Agent, or Firm*—Christie, Parker & Hale, LLP

(57) ABSTRACT

An organic thin film transistor and a flat panel display device using the same are disclosed. The organic thin film transistor includes an inorganic layer doped with an impurity in a region of the outer surfaces of source and drain electrodes, or the source and drain electrodes is formed by an inorganic material doped with an impurity. According to the organic thin film transistor, an energy barrier is generated when contact between the organic semiconductor and the source and drain electrodes is removed to form an ohmic contact.

22 Claims, 5 Drawing Sheets

U.S. PATENT DOCUMENTS

| | | | |
|---|---|---|---|
| 2005/0037549 A1* | 2/2005 | Takemura et al. | 438/164 |
| 2005/0121674 A1* | 6/2005 | Kamata et al. | 257/72 |
| 2005/0139823 A1* | 6/2005 | Hirakata et al. | 257/40 |
| 2006/0246620 A1* | 11/2006 | Nagayama et al. | 438/99 |

FOREIGN PATENT DOCUMENTS

| | | |
|---|---|---|
| JP | 2004-103905 | 4/2004 |
| JP | 2004-146430 | 5/2004 |
| KR | 10-2005-0020610 | 3/2005 |

OTHER PUBLICATIONS

Patent Abstracts of Japan, Publication No. 2004-103905, Published on Apr. 2, 2004, in the name of Nagayama, et al.

Patent Abstracts of Japan, Publication No. 2004-146430, Published on May 20, 2004, in the name of Hirai.

Korean Patent Abstracts, Publication No. 1020050020610 A, Published on Mar. 4, 2005, in the name of Harada, et al.

* cited by examiner

ORGANIC THIN FILM TRANSISTOR AND FLAT PANEL DISPLAY DEVICE USING THE SAME

CROSS-REFERENCE TO RELATED APPLICATION

This application claims priority to and the benefit of Korean Patent Application No. 10-2005-0073946, filed on Aug. 11, 2005, in the Korean Intellectual Property Office, the entire content of which is incorporated herein by reference.

BACKGROUND

1. Field of the Invention

The present invention relates to an organic thin film transistor and a flat panel display device using the same, and more particularly, to an organic thin film transistor formed between source and drain electrodes and an organic semiconductor and a flat panel display device using the same.

2. Discussion of Related Art

When fabricating an organic semiconductor device, an energy barrier between an organic semiconductor and a metal should be removed by forming an ohmic contact between the organic semiconductor and the metal. In a conventional organic semiconductor device, pentacene, and poly-3-hexylthiophene, fluorene-bithiophene are used as a p-type organic semiconductor, and lutetium bisphthalocyanine, thulium bisphthalocyanine, tetracyanoquinodimethane (TCVQ), C60, C70, 1,4,5,8-naphthalene tetracarboxylic dianhydride (NTCDA), 1,4,5,8-naphthanlene tetracarboxylic diimide (NTCDI), 11,11,12,12-tetracyanonaphtho-2,6-quinodimethane (TCNNQ), NTCDI-C8H, NTCDI-C12H, NTCDI-C18H, NTCDI-BnCF3, and NTCDI-C8F are used as an N-type organic semiconductor.

Since the organic transistor materials have high work functions ranging from 5.1 eV to 5.5 eV, the ohmic contact is formed using gold (Au) satisfying the high work functions or surface-treated indium-tin oxide (ITO). However, since a shadow mask type patterning is required when using gold as the ohmic contact, gaps between channels are limited by the mask edges; and, when ITO is used as the ohmic contact, the lifespan and the stability of the device deteriorate.

SUMMARY OF THE INVENTION

Accordingly, it is an aspect of the present invention to provide an organic thin film transistor in which an ohmic contact is formed between source and drain electrodes and an organic semiconductor layer of an organic thin film transistor and a flat panel display device using the same.

In an embodiment of the present invention, an organic thin film transistor includes: a gate electrode; a gate insulator layer insulating the gate electrode; an organic semiconductor layer contacting the gate insulator layer; source and drain electrodes contacting the organic semiconductor layer; and an inorganic layer on at least one region of the source and drain electrodes, wherein the inorganic layer is doped with an impurity.

In one embodiment, the organic semiconductor layer contacting the source and drain electrodes is an n-type semiconductor, and a work function of the inorganic layer doped with the impurity is less than a work function of the organic semiconductor layer.

In one embodiment, the organic semiconductor layer contacting the source and drain electrodes is a p-type semiconductor, and a work function of the inorganic layer doped with the impurity is higher than a work function of the organic semiconductor layer.

In another embodiment of the present invention, an organic thin film transistor includes: a gate electrode; a gate insulator layer insulating the gate electrode; an organic semiconductor layer contacting the gate insulator layer; and source and drain electrodes contacting the organic semiconductor layer, the source and drain electrodes including an inorganic material doped with an impurity.

In yet another embodiment of the present invention, a flat panel display device includes: an organic thin film transistor electrically connected to a light emission device and adapted to drive the same, the organic thin film transistor including source and drain electrodes, an organic semiconductor layer contacting the source and drain electrodes, and an inorganic layer on at least one region of the source and drain electrodes, the inorganic layer being doped with an impurity.

In yet another embodiment of the present invention, a flat panel display device includes: an organic thin film transistor electrically connected to a light emission device and adapted to drive the same, the organic thin film transistor including source and drain electrodes and an organic semiconductor: layer contacting the source and drain electrodes formed by an inorganic material doped with an impurity.

As such, in an organic thin film transistor in accordance with one embodiment of the present invention, the organic thin film transistor includes source and drain electrodes and an organic semiconductor layer. In this embodiment, an ohmic contact is formed between the source and drain electrodes and the organic semiconductor layer so that emission efficiency and stability are enhanced. In addition, by simply adjusting a doping concentration of impurities constituting an inorganic layer or the source and drain electrodes, this embodiment of the present invention allows the ohmic contact condition to change according to the kind of the organic semiconductor layer implemented.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following detailed description, certain exemplary embodiments of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, rather than restrictive.

Figure 2A:
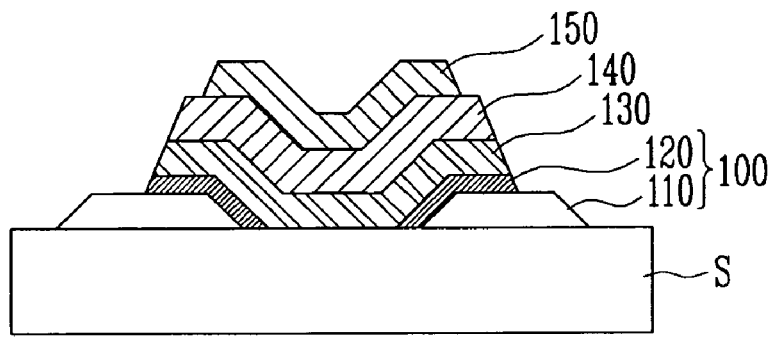
FIGS. 2A and 2B are sectional views illustrating a top gate type organic thin film transistor and a bottom gate type organic thin film transistor according to a first embodiment of the present invention.
Figure 2B:
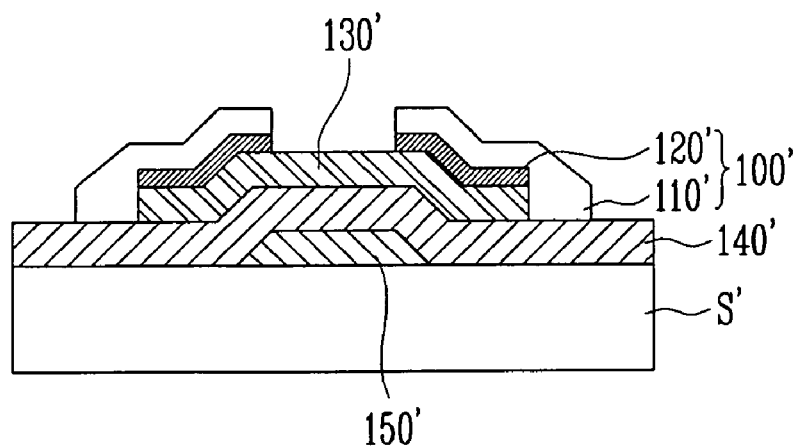

FIGS. 2A and 2B are schematic views illustrating a top gate type (or a staggered structured) organic thin film transistor and a bottom gate type (or an inverted staggered structured) organic thin film transistor according to a first embodiment of the present invention. The organic thin film transistor according to the first embodiment of the present invention includes an electrode layer 110 (or 110'), source and drain electrodes 100 (or 100') made of an impurity doping inorganic layer (or one ore more doping inorganic layers) 120 (or 120') formed at an outer side of the electrode layer 110 (or 110'), an organic semiconductor layer 130 (or 130'), a gate insulator layer 140 (or 140'), and a gate electrode 150 (or 150').

The source and drain electrodes 100 (or 100') of the organic thin film transistor include an ohmic contact layer made of the impurity doping inorganic layer 120 (or 120') contacting the organic semiconductor layer 130 (or 130').

The inorganic layer 120 (or 120') may be fabricated in various shapes and thicknesses according to the type of the organic transistor being used, and, in one embodiment, the inorganic layer 120 (or 120') is made of silicon. However, the present invention is not thereby limited; for example, the inorganic layer 120 (or 120') may be fabricated of compounds containing silicon and/or may be a germanium semiconductor.

In the inorganic layer 120 (or 120'), impurities are doped to adjust a work function. For example, when the organic semiconductor layer 130 (or 130') is an n-type layer, the inorganic layer 120 (or 120') is doped with antimony (Sb), arsenic (As), and/or phosphorus (P), and when the organic semiconductor layer 130 (or 130') is a P-type layer, the inorganic layer 120 (or 120') is doped with boron (B), gallium (Ga), and/or indium (In).

The organic semiconductor layer 130 (or 130') can be used to form p- or n-type transistors. In the organic semiconductor layer 130 (or 130'), pentacene, and poly-3-hexylthiophene, fluorene-bithiophene are used as a p-type organic semiconductor, and lutetium bisphthalocyanine, thulium bisphthalocyanine, tetracyanoquinodimethane (TCVQ), C60, C70, 1,4,5,8-naphthalene tetracarboxylic dianhydride (NTCDA), 1,4,5,8-naphthanlene tetracarboxylic diimide (NTCDI), 11, 11, 12, 12-tetracyanonaphtho-2,6-quinodimethane (TCNNQ), NTCDI-C8H, NTCDI-C12H, NTCDI-C18H, NTCDI-BnCF3, and NTCDI-C8F are used as an N-type organic semiconductor.

The gate insulator layer 140 (or 140') is a layer for insulating the organic semiconductor layer 130 (or 130') and the gate electrode 150 (or (150') and may be formed by inorganic or organic materials.

The gate electrode 150 (or 150') is formed as a top gate type electrode 150 when the transistor has a staggered structure, and as a bottom gate type electrode 150' when the transistor has an inverted staggered structure.

In other words, in the staggered structure as shown in FIG. 2A, the source and drain electrodes 100 are spaced apart from each other on a substrate S, the organic semiconductor layer 130 is provided on at least one region of the source and drain electrodes 100, the gate insulator layer 140 is formed on the organic semiconductor layer 130, and the gate electrode 150 is formed on the gate insulator layer 140.

By contrast, in the inverted staggered structure of FIG. 2B, the gate electrode 150' is provided on a region of a substrate S', the gate insulator layer 140' is provided on the gate electrode 150' and the substrate S', the organic semiconductor layer 130' is provided at a position on a region of the gate insulator layer 140' corresponding to the organic semiconductor layer 130', and at least a part of the source and drain electrodes 100' is provided on the organic semiconductor layer 130'.

Figure 1:
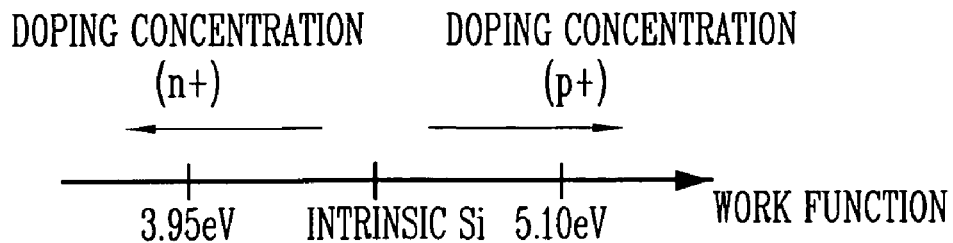
FIG. 1 is a conceptual view illustrating change of a work function of an inorganic semiconductor according to the kind of dopant used.

FIG. 1 is a conceptual view illustrating change of a work function of an inorganic semiconductor according to the kind of dopant used.

In a transistor having a p-type organic semiconductor layer (e.g., 130 or 130') according to the first embodiment, an inorganic layer (e.g., 120 or 120') is doped to have a work function higher than a work function of the p-type organic semiconductor layer. In this case, referring also to FIG. 1, when silicon is used as the inorganic layer (or p-type semiconductor), the above-described condition can be satisfied by doping the silicon with a dopant density at more than $10^{18}/cm^3$ when the work function of the p-type semiconductor is 5.1 eV. For example, if the organic semiconductor layer contacting the source and drain electrodes is formed by pentacene and the inorganic layer forming the outer sides of the source and drain electrodes is formed by silicon, then the inorganic layer may be doped with boron at a dopant density of $10^{19}/cm^3$.

By contrast, in a transistor having an n-type organic semiconductor layer (e.g., 130 or 130') according to the first embodiment of the present invention, an inorganic layer (e.g., 120 or 120') is doped to have a work function lower than a work function of the n-type organic semiconductor layer. However, in this transistor (or the n-type organic transistor), the ohmic contact can be formed without doping, but doping is still performed in one embodiment of the invention to adjust the work function.

Also, although the organic thin film transistor having the staggered structure and the inverted staggered structure according to the present invention has been described above with reference to FIGS. 2A and 2B, it should be understood by those skilled in the art that the organic thin film transistor of the present invention may be applied to the above-described staggered structure, the above-described inverted staggered structure, an inverted coplanar structure, and/or an coplanar structure.

Hereinafter, a manufacturing method of the organic thin film transistor having the staggered structure containing electrodes (or layers) according to the first embodiment of the present invention will be described with reference to FIGS. 3A to 3E. Through this description, it should be understood by those skilled in the art that the electrodes of the first embodiment of the present invention can easily be applied to other type transistors.

The manufacturing method includes a source and drain electrode forming step, an organic semiconductor layer forming step, an insulator layer forming step, and a gate electrode forming step. The source and drain electrode forming step includes: forming the electrode layer 110 on a substrate S with metal or ITO in a pattern (which may be predetermined) and doping impurities after forming the inorganic layer 120 on the electrode layer 110. The organic semiconductor layer forming step includes forming the organic semiconductor layer 130 on and between the electrodes 100 with organic semiconductors. The insulator layer forming step includes forming the gate insulator layer 140 on the organic semiconductor layer 130, and the gate electrode forming step includes forming the gate electrode 150 on the insulator layer 140.

Figure 3A:
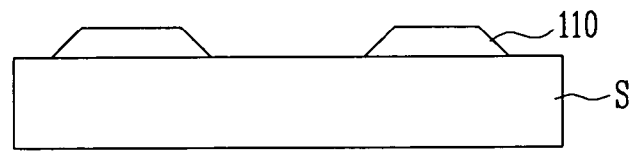
FIGS. 3A, 3B, 3C, 3D, and 3E are sectional views sequentially illustrating the manufacturing process of a top gate type organic thin film transistor according to the first embodiment of the present invention.

In the forming of the electrode layer 110 on the substrate S with metal or ITO, a metal layer or an ITO layer is formed on the substrate S by sputtering, vapor-deposition, and/or plating, and is then patterned by etching and/or lift-off method so that the electrode layer 110 can be formed (see FIG. 3A).

Figure 3B:
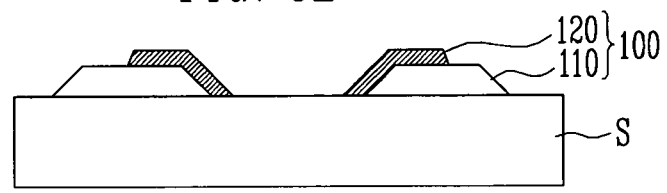
Figure 3C:
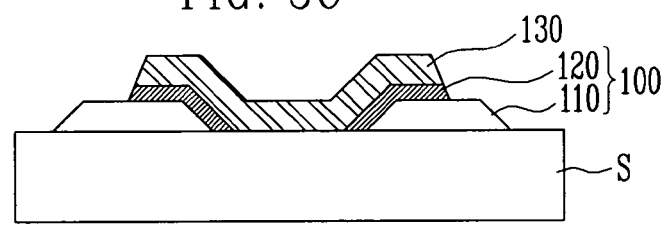
Figure 3D:
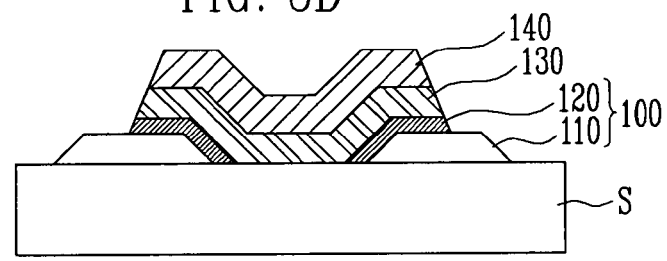
Figure 3E:
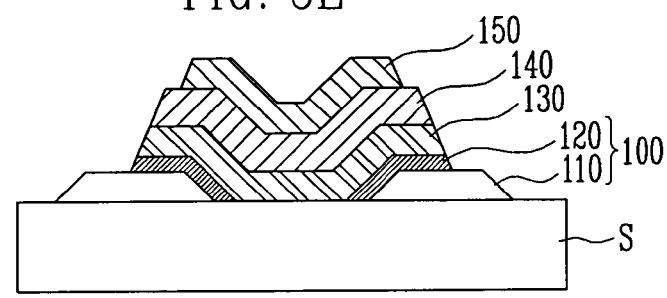

The doping of impurities after forming the inorganic layer 120 on the electrode layer 110 includes a process of forming the ohmic contact layer as the inorganic layer 120 doped with impurities on the electrode layer 110 to enable the ohmic contact between the electrodes 100 and the organic semiconductor layer 130 (see FIG. 3B).

For example, it should be apparent to those skilled in the art that the inorganic layer 120 may be formed by various vapor-deposition methods such as CVD, and any unnecessary part thereof may be removed by photolithography, but the present invention is not limited to this.

Also, the doping of impurities includes a process of injecting impurities into the inorganic layer 120 to change the work function of the inorganic layer 120, The amount and kind of the impurities injected into the ohmic contact layer are determined to satisfy the ohmic contact condition according to the work function formed by the organic semiconductor. In other words, as described above, if the organic semiconductor layer 130 is an n-type organic semiconductor layer, then in order to form the ohmic contact of the electrodes, the n-type organic semiconductor layer (and/or inorganic semiconductor layer) is doped such that the work function of the inorganic layer 120 is less than the work function of the organic semiconductor layer 130. By contrast, if the organic semiconductor layer 130 is a p-type organic semiconductor layer, then in order to form the ohmic contact of the electrodes, the p-type organic semiconductor layer (and/or inorganic semiconductor layer) is doped such that the work function of the inorganic layer 120 is greater than the work function of the organic semiconductor layer 130. Antimony (Sb), arsenic (As), or phosphorus (P), boron (B), gallium (Ga), or indium (In) may be used as the impurities, and ion implantation and/or thermal diffusion may be used as the injection method.

The organic semiconductor layer forming step is a step of forming the organic semiconductor layer 130 on a region of the ohmic contact layer and the substrate, and the organic semiconductor layer 130 is formed by the above-described n-type or p-type organic semiconductor. The organic semiconductor layer 130 may be formed by known coating method and/or printing method (see FIG. 3C).

The insulator layer forming step is a step of forming the insulator layer 140 for insulating the gate electrode 150 to be laminated on the upper side of the organic semiconductor layer 130, and coating method and/or printing method may be used to form the insulator layer as an organic insulator layer. Alternatively, thermal diffusion, CVD, and/or SOG may be used to form the insulator layer as an inorganic insulator layer (see FIG. 3D).

The gate electrode forming step is a step of forming the gate electrode 150 by patterning a gate metal on the gate insulator layer. This can be achieved by forming a metal layer on whole surface of the insulator layer, coating a resist layer, etching unnecessary part, and finally removing the resist layer. However, the gate electrode forming step of the present invention is not limited to these methods (see FIG. 3E).

By contrast, in a second embodiment of the present invention, electrodes (or layers) of the organic semiconductor device can be formed with impurities doped inorganic materials. In other words, instead of forming the ohmic contact layer on the metal electrode layer as is in the first embodiment, the second embodiment uses the impurities doped inorganic material as an electrode because the impurities doped inorganic material is conductive and is directly connected to metal wires.

Figure 4A:
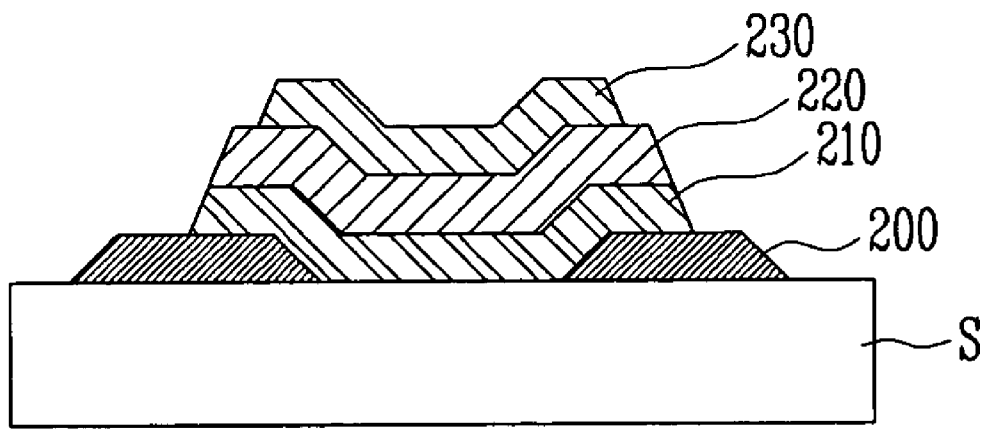
FIGS. 4A and 4B are sectional views illustrating a top gate type organic thin film transistor and a bottom gate type organic thin film transistor according to a second embodiment of the present invention.
Figure 4B:
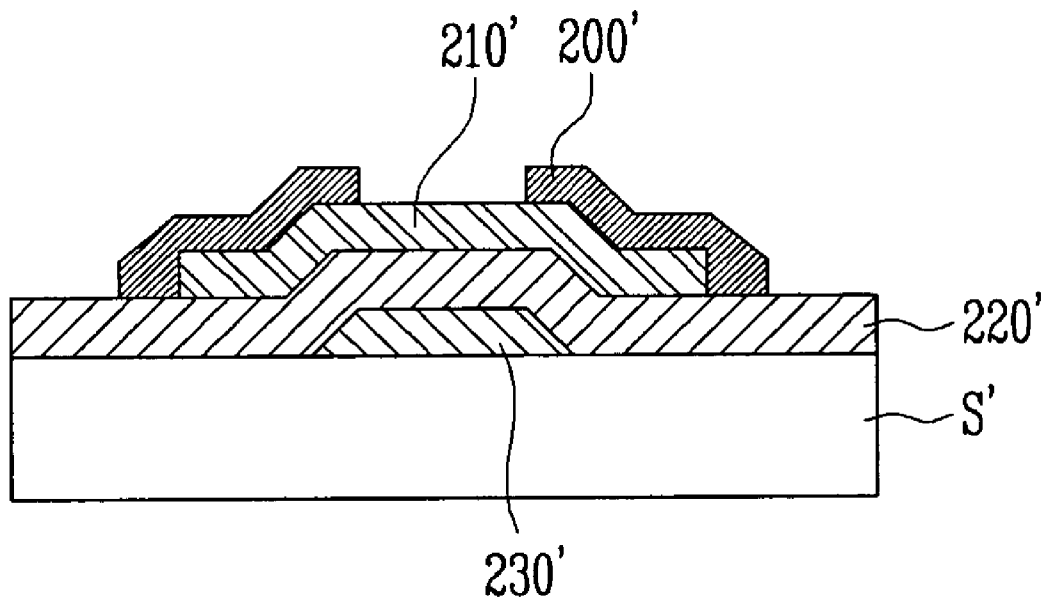
Figure 5A:
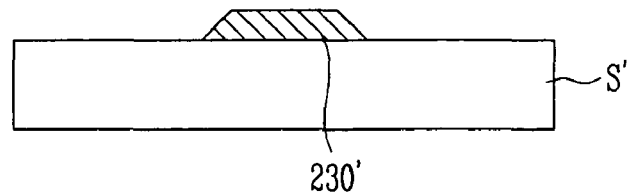
FIGS. 5A, 5B, 5C, and 5D are sectional views sequentially illustrating the manufacturing process of a bottom gate type organic thin film transistor according to the second embodiment of the present invention.
Figure 5B:
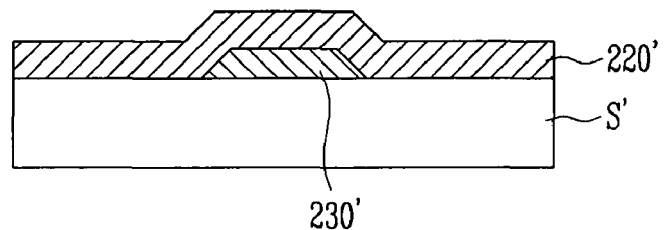
Figure 5C:
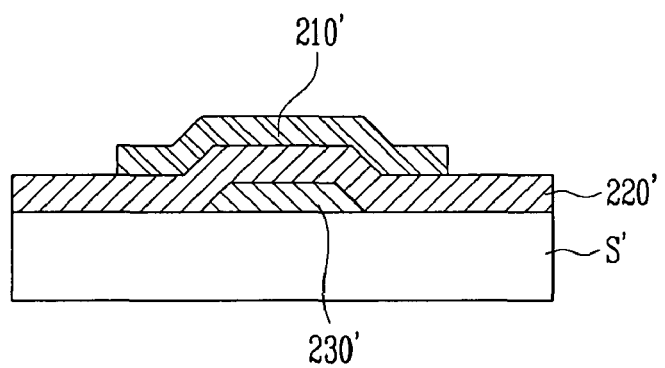
Figure 5D:
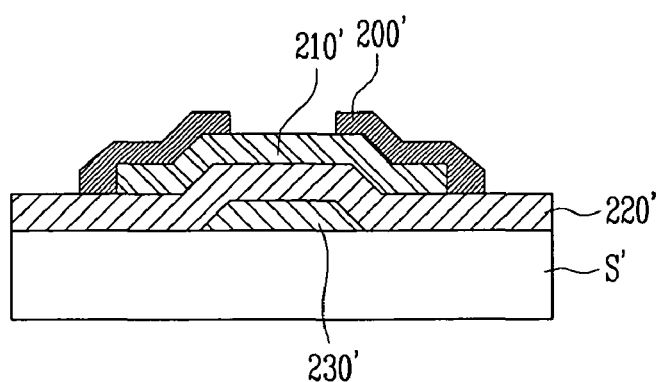

FIGS. 4A and 4B are schematic structural views illustrating an organic thin film transistor of a staggered structure and an organic thin film transistor of an inverted staggered structure according to a second embodiment of the present invention.

As shown in FIGS. 4A and 4B, the organic thin film transistor is substantially the same as the organic thin film transistor employing the electrodes according to the first embodiment including the source/drain electrodes 200 (or 200'), an organic semiconductor layer 210 (or 210'), a gate insulator layer 220 (or 220'), and a gate electrode 230 (or 230'). However, the organic thin film transistor of FIGS. 4A and 4B is different from the organic thin film transistor of FIGS. 2A and 2B in that the source and drain electrodes 200 (or 200') are formed by impurities doped-inorganic materials and contact the organic semiconductor layer 210 (or 210'). Thus, a detailed description of general components of the organic thin film transistor except for the source and drain electrodes 200 will be omitted.

As shown, each of the source and drain electrodes 200 (or 200') of the organic thin film transistor is formed by the impurities-doped inorganic material. In one embodiment, the inorganic material is silicon, but the present invention is not limited to this; e.g., a semiconductor containing silicon and germanium may be used. The impurities may be antimony (Sb), arsenic (As), and/or phosphorus (P) when the organic semiconductor layer 210 is an n-type layer, and may be boron (B), gallium (Ga), and/or indium (In) when the organic semiconductor layer is a p-type layer.

In a transistor having a p-type organic semiconductor layer (e.g., 210 or 210') according to the second embodiment, an inorganic material is doped to have a work function higher than a work function of the p-type organic semiconductor layer. In this case and referring also to FIG. 1, when silicon is used as the inorganic material (or p-type semiconductor), the above-described condition can be satisfied by doping the silicon with a dopant density at more than $10^{18}/cm^3$ when the work function of the p-type semiconductor is 5.1 eV. For example, if the organic semiconductor layer contacting the source and drain electrodes is formed by pentacene and the inorganic material forming the source and drain electrodes is formed by silicon, then the inorganic material may be doped with boron at a dopant density of $10^{19}/cm^3$.

By contrast, in a transistor having an n-type organic semiconductor layer (e.g., 210 or 210') according to the second embodiment of the present invention, an inorganic material is doped to have a work function lower than a work function of the n-type organic semiconductor layer. However, in this transistor (or the n-type organic transistor), the ohmic contact can be formed without doping, but doping is still performed in one embodiment of the invention to adjust the work function.

Also, although the organic thin film transistor having the staggered structure and the inverted staggered structure according to the present invention has been described above, it should be understood by those skilled in the art that the organic thin film transistor of the present invention may be applied to the above-described staggered structure, the above-described inverted staggered structure, an inverted coplanar structure, and an coplanar structure.

Hereinafter, a manufacturing method of the organic thin film transistor having the bottom gate type inverted staggered structure containing electrodes (or layers) according to the second embodiment of the present invention will be described with reference to FIGS. 5A to 5D. Through this description, it should be understood by those skilled in the art that the electrodes of the second embodiment of the present invention can easily be applied to other type transistors.

FIGS. 5A to 5D are sectional views sequentially illustrating the manufacturing process of an organic thin film transistor having the inverted staggered structure according to the second embodiment of the present invention, and as shown in FIGS. 5A to 5D, the manufacturing process includes a gate electrode forming step, an insulator layer forming step, an organic semiconductor layer forming step, and an electrode forming step.

The manufacturing process includes a gate electrode forming step for forming a gate electrode on a substrate, an insulator layer forming step, an organic semiconductor layer forming step of forming an organic semiconductor layer on the insulator layer, and an electrode forming step of doping impurities on the organic semiconductor layer. For description clarity, the electrode forming step will be described in more detail, while the other steps will be described briefly.

The gate electrode forming step is a step of forming the gate electrode 230' on the substrate S' by etching, a lift-off method, etc. (see FIG. 5A), the insulator layer forming step is a step for forming the insulator layer 220' on the gate electrode and the substrate to insulate the gate electrode 220' (see FIG. 5B), and the organic semiconductor layer forming step is a step of forming the organic semiconductor layer 210' formed by an organic semiconductor for connecting the source electrode to the drain electrode using a coating method and/or a printing method (see FIG. 5C).

The electrode forming step is a step of forming the source and drain electrodes 200' formed on the top of the organic semiconductor layer 210' with the impurities-doped materials. Here, the electrodes 200' may be formed by forming an electrode layer with an inorganic semiconductor and injecting ions into the electrode layer to form the impurities doped inorganic electrodes 200', or the electrodes 200' may be formed by depositing gas containing impurity such as a silane (SiH$_4$) (see FIG. 5D).

In addition, if the impurities are injected, in a case when the organic semiconductor layer 210' is an n-type organic semiconductor layer, then in order to form the ohmic contact of the electrodes, the n-type organic semiconductor layer (and/or the inorganic semiconductor layer) is doped such that the inorganic material (or the inorganic material of the inorganic electrodes 200') has a work function less than a work function of the organic semiconductor layer 210'. Moreover, in a case when the organic semiconductor layer 210' is a p-type organic semiconductor layer, in order to form the ohmic contact of the electrodes, the p-type organic semiconductor layer (and/or the inorganic semiconductor layer) is doped such that the inorganic material (or the inorganic material of the inorganic electrodes 200') has a work function higher than a work function of the organic semiconductor layer 210. As the impurities, antimony (Sb), arsenic (As), phosphorus (P), boron (B), gallium (Ga), and indium (In) may be used. Moreover, ions may be injected by ion implantation and/or thermal diffusion.

Next, a flat panel display device using one or more organic thin film transistors as described above will be described. The flat panel display device according to one embodiment of the present invention includes a display region having a light emission device and a driving part including the one or more organic thin film transistors electrically connected to the light emission device. Those skilled in the art should understand that the organic thin film transistor may be applied to any flat panel display device, and, in one embodiment, may be applied to an organic light emission display device.

Figure 6:
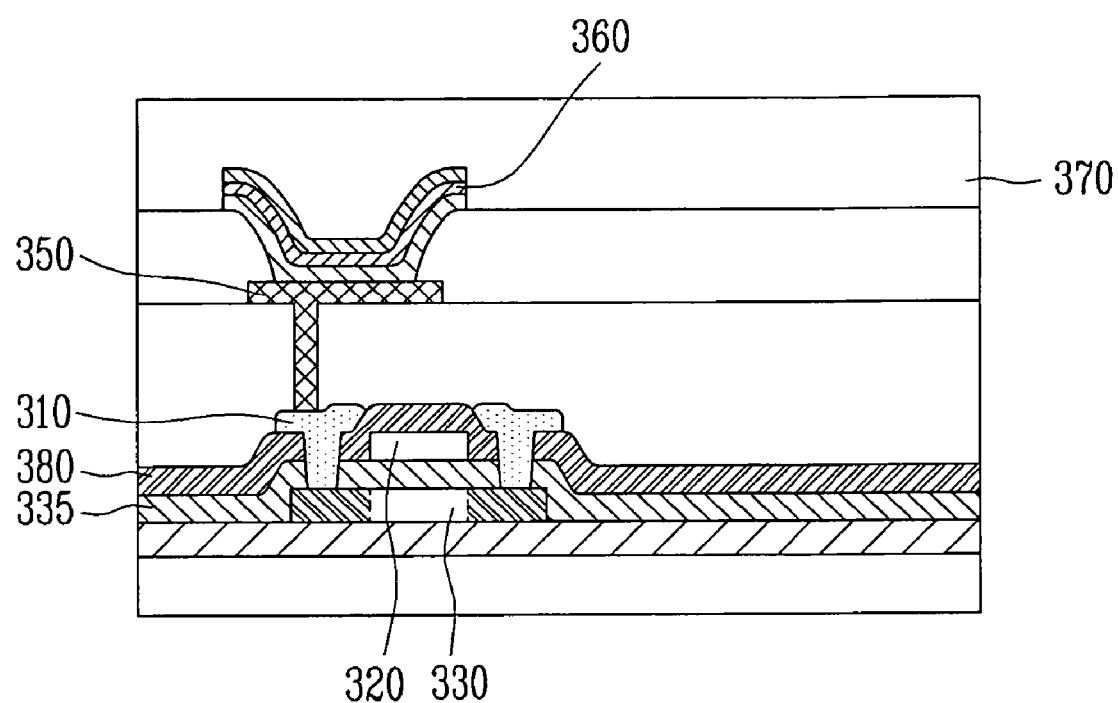
FIG. 6 is a sectional view illustrating an organic thin film transistor electrically connected to an organic light emission device.

FIG. 6 illustrates a coplanar structured organic thin film transistor electrically connected to an organic light emission device of a flat panel display device. As shown in the drawing, the organic semiconductor layer 330 is provided on a region of a substrate, a gate insulator layer 335 is provided on organic semiconductor layer 330, a gate electrode 320 is formed at a position of a region of the gate insulator layer 335 corresponding to the organic semiconductor layer 330, an interlayer insulator layer 380 is further formed on the gate electrode 320, and the source and drain electrodes 310 are formed on the interlayer insulator layer 380 and contacts the organic semiconductor layer 330 through one or more contact holes formed to expose a region (or regions) of the organic semiconductor layer 330, wherein the region may be predetermined.

The source and drain electrodes 310 are formed by an inorganic material doped with impurities and electrically connected to a first electrode 350 of the organic light emission device to drive the organic light emission device.

Although certain embodiments of the present invention have been shown and described, it would be appreciated by those skilled in the art that changes might be made in these embodiments without departing from the principles and spirit of the invention, the scope of which is defined in the claims and their equivalents. For example, those skilled in the art should understand that the shape and the material of the inorganic layer and the kinds of the organic thin film transistor employed in the present invention may be modified.

What is claimed is:

1. An organic thin film transistor comprising:
   a gate electrode;
   a gate insulator layer insulating the gate electrode;
   an organic semiconductor layer contacting the gate insulator layer;
   an inorganic layer contacting the organic semiconductor layer; and
   source and drain electrodes contacting the inorganic layer,
   wherein the inorganic layer is doped with an impurity and provided between the source and drain electrodes and the organic semiconductor layer, and
   wherein the inorganic layer comprises germanium.

2. The organic thin film transistor as claimed in claim 1,
   wherein the organic semiconductor layer is an N-type semiconductor, and
   wherein a work function of the inorganic layer is less than a work function of the organic semiconductor layer.

3. The organic thin film transistor as claimed in claim 2, wherein the impurity includes at least one selected from the group consisting of antimony, arsenic, and phosphorus.

4. The organic thin film transistor as claimed in claim 1, wherein the organic semiconductor layer is a P-type semiconductor, and wherein a work function of the inorganic layer is higher than a work function of the organic semiconductor layer.

5. The organic thin film transistor as claimed in claim 4, wherein the impurity includes at least one selected from the group consisting of boron, gallium, and indium.

6. The organic thin film transistor as claimed in claim 1, wherein the organic semiconductor layer includes pentacene.

7. The organic thin film transistor as claimed in claim 1,
   wherein the source and drain electrodes are provided on a substrate and spaced apart from each other,
   wherein the organic semiconductor layer is formed on one region of the source and drain electrodes and the substrate, wherein the gate insulator layer is formed on the organic semiconductor layer, and
wherein the gate electrode is formed on the gate insulator layer.

8. The organic thin film transistor as claimed in claim 1,
wherein the gate electrode is formed on one region of a substrate,
wherein the gate insulator layer is formed on the gate electrode and the substrate,
wherein the organic semiconductor layer is formed on the gate insulator layer, and at least a part of the source and drain electrodes is formed on the organic semiconductor layer.

9. The organic thin film transistor as claimed in claim 1,
wherein the organic semiconductor layer is formed on one region of the substrate,
wherein the gate insulator layer is formed on the organic semiconductor layer,
wherein the gate electrode is formed on one region of the gate insulator layer corresponding to the organic semiconductor layer,
wherein an interlayer insulator layer is further formed on the gate electrode, and the source and drain electrodes are formed on the interlayer insulator layer and contact the organic semiconductor layer through a contact hole formed to expose a region of the organic semiconductor layer.

10. An organic thin film transistor comprising:
a gate electrode;
a gate insulator layer insulating the gate electrode;
an organic semiconductor layer contacting the gate insulator layer; and
source and drain electrodes contacting the organic semiconductor layer, the source and drain electrodes including an inorganic semiconductor material doped with an impurity,
wherein the source and drain electrodes and the organic semiconductor layer are formed from separate layers, and
wherein the inorganic semiconductor material comprises germanium.

11. The organic thin film transistor as claimed in claim 10, wherein the organic semiconductor layer is an N-type semiconductor, and
wherein a work function of the source and drain electrodes is less than a work function of the organic semiconductor layer.

12. The organic thin film transistor as claimed in claim 11, wherein the impurity includes at least one selected from the group consisting of antimony, arsenic, and phosphorus.

13. The organic thin film transistor as claimed in claim 10, wherein the organic semiconductor layer is a P-type semiconductor, and wherein a work function of the source and drain electrodes is higher than a work function of the organic semiconductor layer.

14. The organic thin film transistor as claimed in claim 13, wherein the impurity includes at least one selected from the group consisting of boron, gallium, and indium.

15. The organic thin film transistor as claimed in claim 10, wherein the organic semiconductor layer includes pentacene.

16. The organic thin film transistor as claimed in claim 10,
wherein the source and drain electrodes are provided on a substrate and spaced apart from each other,
wherein the organic semiconductor layer is formed on one region of the source and drain electrodes and the substrate,
wherein the gate insulator layer is formed on the organic semiconductor layer, and
wherein the gate electrode is formed on the gate insulator layer.

17. The organic thin film transistor as claimed in claim 10,
wherein the gate electrode is formed on one region of a substrate,
wherein the gate insulator layer is formed on the gate electrode and the substrate,
wherein the organic semiconductor layer is formed on the gate insulator layer, and at least a part of the source and drain electrodes is formed on the organic semiconductor layer.

18. The organic thin film transistor as claimed in claim 10,
wherein the organic semiconductor layer is formed on one region of the substrate,
wherein the gate insulator layer is formed on the organic semiconductor layer,
wherein the gate electrode is formed at a position on one region of the gate insulator layer corresponding to the organic semiconductor layer,
wherein an interlayer insulator layer is further formed on the gate electrode, and the source and drain electrodes are formed on the interlayer insulator layer and contact the organic semiconductor layer through a contact hole formed to expose a region of the organic semiconductor layer.

19. A flat panel display device comprising:
an organic thin film transistor electrically connected to a light emission device and adapted to drive the same, the organic thin film transistor including
source and drain electrodes,
an inorganic layer contacting the source and drain electrodes, and
an organic semiconductor layer contacting the inorganic layer, the inorganic layer being doped with an impurity,
wherein the inorganic layer is between the source and drain electrodes and the organic semiconductor layer, and
wherein the inorganic layer comprises germanium.

20. The flat panel display device as claimed in claim 19, wherein the light emission device comprises an organic light emission device.

21. A flat panel display device comprising:
an organic thin film transistor electrically connected to a light emission device and adapted to drive the same,
the organic thin film transistor including source and drain electrodes and an organic semiconductor layer contacting the source and drain electrodes including an inorganic semiconductor material doped with an impurity,
wherein the source and drain electrodes and the organic semiconductor layer are formed from separate layers, and
wherein the inorganic semiconductor material comprises germanium.

22. The flat panel display device as claimed in claim 21, wherein the light emission device comprises an organic light emission device.

* * * * *